United States Patent [19]

Pavelski

[11] Patent Number: 5,725,324
[45] Date of Patent: Mar. 10, 1998

[54] MODULE LATCH ASSEMBLY

[75] Inventor: John Pavelski, Austin, Tex.

[73] Assignee: Tandem Computers Incorporated, Cupertino, Calif.

[21] Appl. No.: 576,747

[22] Filed: Dec. 21, 1995

[51] Int. Cl.⁶ .................................................. F16B 2/18
[52] U.S. Cl. ........................... 403/321; 403/13; 312/111; 312/201; 312/334.44
[58] Field of Search .................... 403/321, 322, 403/324, 325, 49, 373, 13, 331, 333, 14; 312/107, 111, 201, 247, 349, 334.24, 334.27, 334.44; 411/552

[56] References Cited

U.S. PATENT DOCUMENTS

| | | | |
|---|---|---|---|
| 4,423,914 | 1/1984 | Vander Ley | 312/349 X |
| 4,433,881 | 2/1984 | Witten et al. | 312/107 X |
| 4,637,749 | 1/1987 | Jones et al. | 403/322 |
| 4,844,565 | 7/1989 | Brafford et al. | 403/322 X |
| 5,011,355 | 4/1991 | Motoshige | 411/552 |
| 5,194,693 | 3/1993 | Brzozowski et al. | 312/111 X |
| 5,196,993 | 3/1993 | Herron et al. | 312/107 X |
| 5,208,735 | 5/1993 | Twachtmann et al. | 403/322 X |
| 5,332,330 | 7/1994 | Kaneko | 403/321 |

FOREIGN PATENT DOCUMENTS

708423  8/1966  Italy ........................ 312/111

*Primary Examiner*—Harry C. Kim
*Attorney, Agent, or Firm*—Townsend and Townsend and Crew LLP; Guy W. Chambers

[57] ABSTRACT

An effective connector mechanism is described which allows modules to be easily and reliably connected and disconnected. This connector mechanism includes a coordinated arrangement of guide plates featuring mating guide rails and U-shaped channels along with matched sets of tapered pins with tapered slots as well as a spring biased latching mechanism. When mated together, the rails, U-shaped channels, pins and slots lock the modules into engagement in every direction except the forward direction. To prevent forward disengagement, a spring biased latching assembly is provided. This latching assembly features two symmetrically operating latch handles which are each pivotally connected to a T-shaped pawl. When the latch handle is open, the T-shaped pawl rests at the bottom of a ramped runner cut into the walls one module's U-shaped guide channel. As the guide rails from the other module are slid along this U-shaped guide channel, a slot formed in the guide rail of the first module becomes aligned with the ramped runner. At this point, by closing the latch handles, the T-shaped pawl is caused to ride up the ramped runner and into the upper module rail slot in a way which locks the two modules into proper alignment and prevents the upper module from sliding out of engagement through a forward movement. Quick release fasteners are provided at the end of each latch handle to allow the latch handles to be locked into a closed position after the modules are connected.

13 Claims, 7 Drawing Sheets

MODULE LATCH ASSEMBLY

TECHNICAL FIELD OF THE INVENTION

The present invention relates to mechanical connectors for attaching modules, such as computer modules, to one another. More particularly, a coordinated arrangement of guide plates featuring mating rails and U-shaped guide channels along with matched sets of tapered pins with tapered slots as well as a spring biased latching assembly are disclosed to firmly, yet removably, attach modules to one another. This design allows for an easy, effective connection of modules, even where the machining of mechanical connector parts is less than precise.

BACKGROUND OF THE INVENTION

There are many different types of products that are built and sold as modules. These products include computers, filing cabinets, office furniture, stereo systems and intermodal transport containers, to name only a few. These products are designed in modular form, in large part, so that they can fit together with similar modules to yield enhanced performance, storage capacities and other efficiencies.

In fitting modules together, there is invariably the problem of how to attach them easily, yet firmly, and often removably. Many times, the modules will be placed in environments where they are subjected to vibration and torsional stress. If the modules are not connected together well, this vibration and torsional stress can cause the modules to come apart. In the case of computer modules, valuable computer equipment can be ruined if the modules come apart under stress, not to mention the collateral hazards to computer operators and the surroundings that disconnected computer modules can cause.

Over the years, a number of techniques have been developed to connect modules together. Common techniques include strapping, gluing, nailing, welding, bolting and attaching with screws and brackets. Many of these common techniques have serious drawbacks, particularly for expensive computer equipment. For example, straps often have a tendency to loosen or tear when vibrated, which can cause modules to disconnect at the most inopportune times. Gluing or welding creates a connection which is not easily removable and, under certain circumstances, cracks under a jolting vibration. Nailing, bolting and bracketing can damage the modules, become loosened under vibration and cause cold welding in the case of metal modules.

In more sophisticated module connection designs, pins are constructed on a connecting face of one module and mating slots are constructed on a connecting face of an adjacent module. The slots are typically either V-shaped or U-shaped. In the case of V-shaped slots, the pins will often jam into the narrow end of the slot, which is helpful in holding the modules together, but not so helpful when the pin cannot be easily removed from the slot due to wedging or cold welding. In the case of U-shaped slots, the risk of wedging or cold welding is diminished, but there will often be too much opportunity for the pin to move within the slot and thereby jar the contents of the modules during vibration. Moreover, for computer modules, it is often important for the pins to be in constant contact with the slots to electrically ground all of the connected modules.

SUMMARY OF THE INVENTION

The present invention provides an effective connector mechanism which allows modules, such as computer modules, to be easily and reliably connected and disconnected. This connector mechanism includes a coordinated arrangement of guide plates featuring mating guide rails and U-shaped guide channels along with matched sets of tapered pins with tapered slots as well as a spring biased latching mechanism. In the preferred embodiment, two parallel guide plates featuring U-shaped guide channels are attached to the top surface of a lower module and, in a corresponding position, two parallel guide plates with guide rails are attached to the bottom surface of an upper module. At each end of the two U-shaped guide channels are tapered pins. Similarly, at each end of the guide rails are tapered slots which are aligned to mate with the tapered pins. The pins and slots are "tapered" in the sense that the pins have a slanted surface on the shank directly underneath the head which urges the guide plate surface adjoining the slot downward after engagement and the slots have a slanted edge at their closed end which maintains contact with the pin after engagement, all the while preventing wedging of the pin. When mated together, the pins and slots lock the upper and lower modules into engagement in every direction except the forward direction.

To prevent the upper module from sliding out of engagement through forward movement, a spring biased latching assembly is provided at the back of the lower module. This latching assembly features two symmetrically operating latch handles which are each pivotally connected to a T-shaped pawl. When the latch handles are open, the T-shaped pawls rest at the bottom of ramped runners cut into the walls the lower module's U-shaped guide channels. As the guide rails from the upper module are slid along the U-shaped guide channels to align the two modules, a slot formed in the guide rail of the upper module becomes aligned with the ramped runner. At this point, by closing the latch handles, the T-shaped pawl is caused to ride up the ramped runner and into the upper module rail slot in a way which locks the two modules into proper alignment and prevents the upper module from sliding out of engagement through a forward movement. Quick release fasteners are provided at the end of each latch handle to allow the latch handles to be locked into a closed position after the modules are connected.

An additional feature of the latching assembly is the use of counterbalancing springs to urge the closed latch handles outward and provide a constant tensioning force on the locked latching system. These counterbalancing springs also continually urge the tapered pins and slots into full engagement so that any vibration of the modules will not lead to an unseating of the locking mechanism.

DESCRIPTION OF THE SPECIFIC EMBODIMENTS

Figure 1:
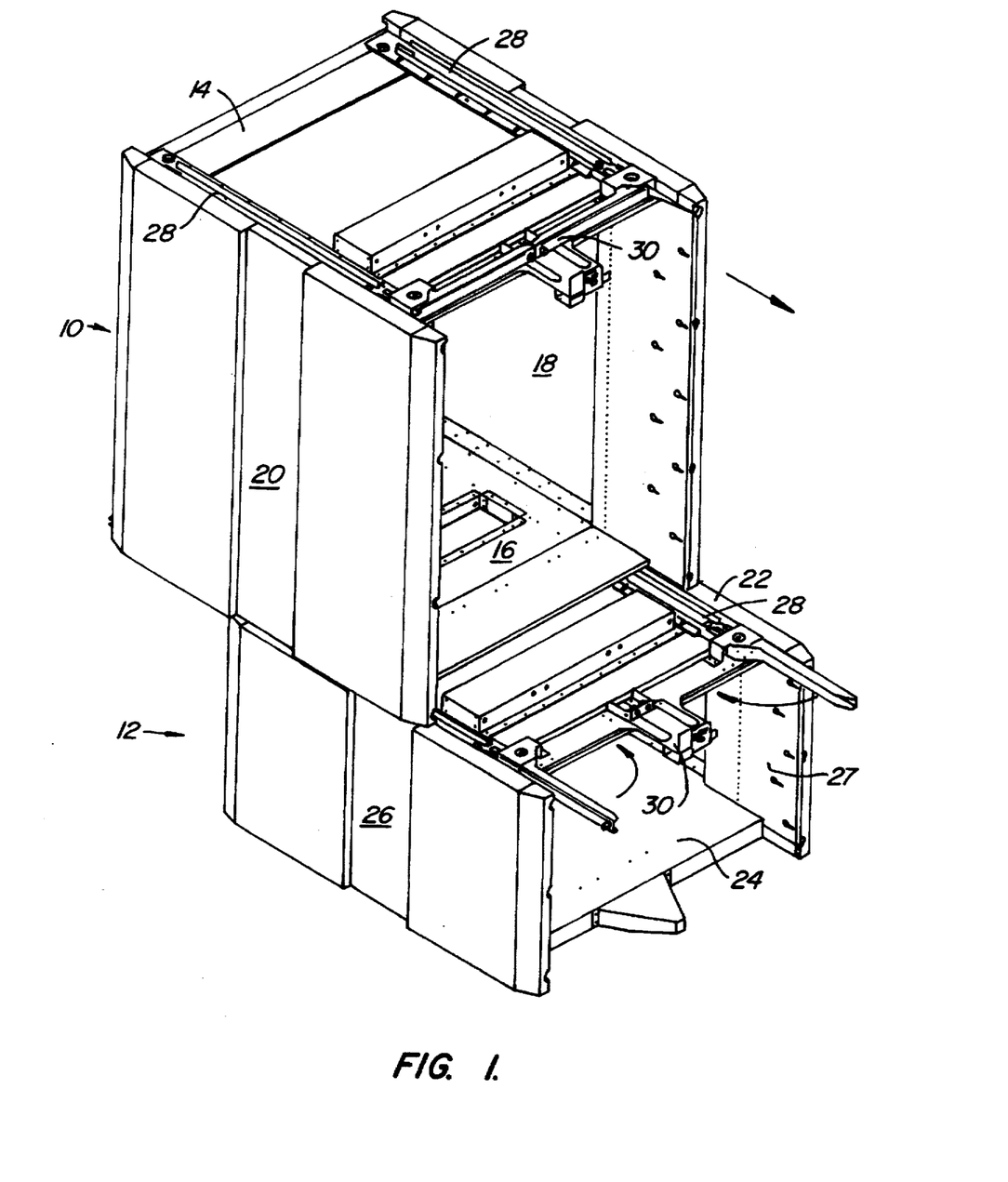
FIG. 1 shows a perspective view of two modules being connected together using a preferred form of module connection mechanism of the present invention.

Referring now to FIG. 1, an upper module 10 and lower module 12 are shown in the process of being connected using a preferred form of module connection mechanism of the present invention. These modules 10, 12 are generally prism shaped, having top faces 14, 22, bottom faces 16, 24 and side faces 18, 20, 26, 27. In the particular embodiment shown in FIG. 1, the front and back faces are left open so that equipment can be easily inserted into and removed from the modules. While prism shaped modules are illustrated in this preferred embodiment, the module connection mechanism of the present inventions can easily work with other shapes of modules, such as polygonal shaped modules, so long as there are surfaces on adjoining modules which can mate flushly to one another.

On the top face 14, 22 of each module 10, 12 is a pair of parallel guide plates 28 disposed along the side edges which extend roughly from the front to the rear of the module and terminate at a latching assembly 30 in the back. These guide plates 28 can be connected to the module in any number of known ways including riveting, screwing, bolting, welding and gluing. Alternatively, the guide plates 28 can be formed as an integral part of the modules through processes such as injection molding.

Figures 2A, 2B:
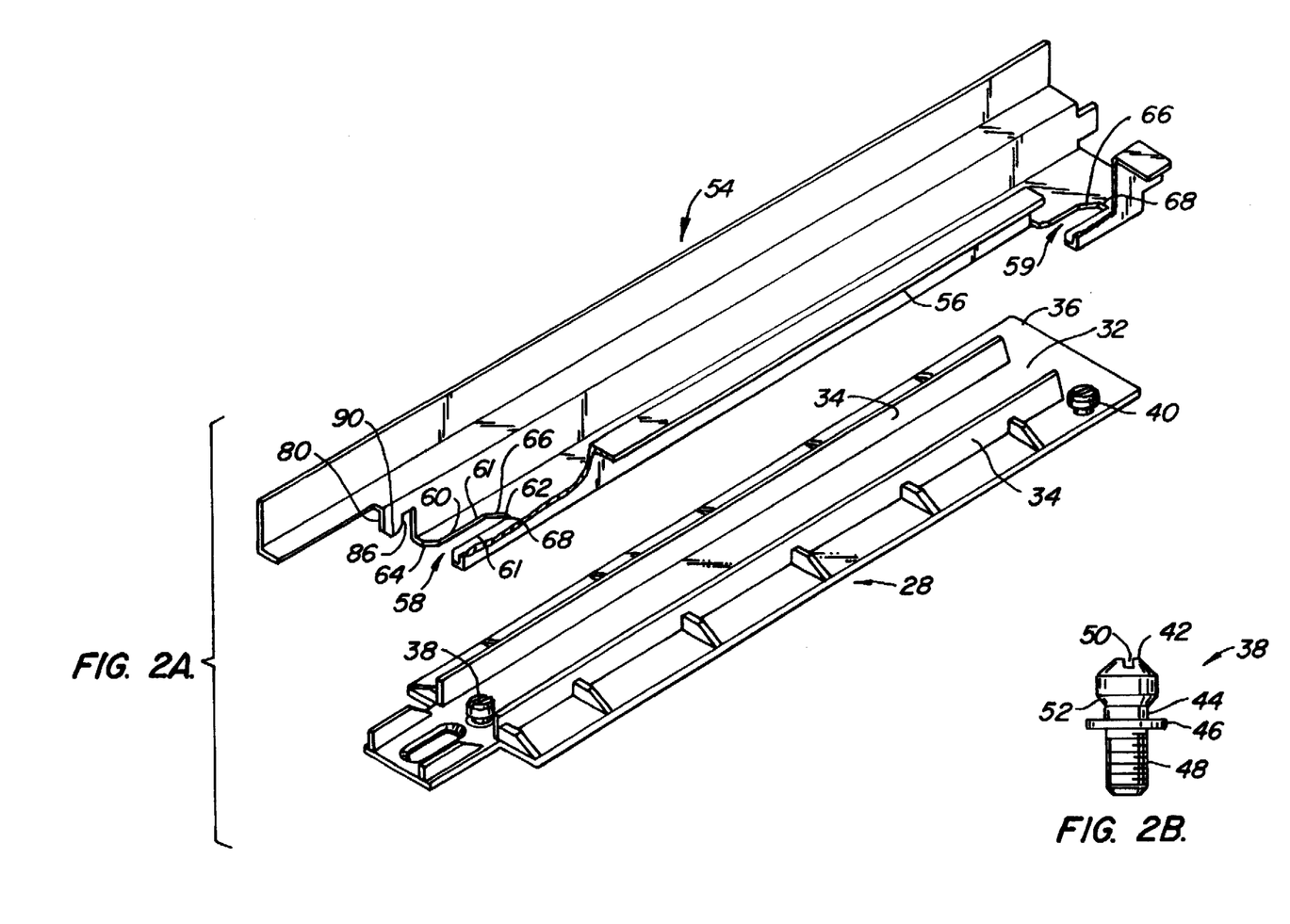
FIG. 2A shows a close up view of the guide plates of the present invention including a guide rail with tapered slots for the upper module and a U-shaped guide channel with tapered pins for the lower module.
FIG. 2B shows a side view of a tapered pin of the present invention.

As better shown in FIG. 2A, the guide plates 28 feature an upwardly open U-shaped channel 32 which, in the preferred embodiment, is formed from the flat base of the plate 36 and two perpendicular walls 34. The guide plate 28 can be constructed from a variety of durable materials, including metals and molded plastic. To add strength, buttresses can be formed on the outside of the U-shaped channel walls 34.

At each end of the guide plate 28 are tapered pins 38, 40. One of these pins 38 is preferably placed within the U-shaped channel while the other pin 40 is placed outside, but adjacent to, the U-shaped channel 32. FIG. 2B shows a cross-sectional view of such a tapered pin 38. This preferred form of tapered pin 38 has a head 42, shank 44, flange 46 and root 48. The head 42 of the tapered pin may be formed with a slot 50 to accept either a flat or phillips head screw driver. Between the pin head 42 and shank 44, is a slanted taper 52. The tapered pin 38 can be formed of any number durable materials, such as metals and plastic, and be attached to the guide plate 28 in a variety of known ways, including riveting, screwing or welding. The tapered pin 38 can also be formed integrally with the guide plate 28 through processes such as injection molding.

To mate with guide plate 28, mating guide plate 54 is provided. A pair of parallel mating guide plates 54 are preferably disposed along the side edges of the bottom face 16, 24 (FIG. 1) of each module 10, 12 and extend roughly from the front to the rear of the module. The mating guide plates 54 can be affixed to the module 10, 12 in the same way as guide plate 28 and can also be construct of the same materials.

As shown in FIG. 2A, mating guide plate 54 features an outwardly extending section which takes the form of a rail 56. This rail 56 should be slightly less in width than the internal width of the U-shaped channel 32. At one end of the rail 56, a slot 58 is formed having an open end 60, a closed end 62 and two parallel sides 61. A second slot 59 is also preferably formed at the other end of the guide plate 54 and positioned adjacent to the rail 56. The open end 60 of each slot 58, 59 is flanked by diagonally oriented external tapers 64 which, when the plates 28, 54 are moved together and slightly misaligned, tend to urge the pin 38 into the slot 58, 59. At its closed end 62, each slot 58, 59 has another flat, diagonal tapered surface 66. This internal tapered surface 64 extends across roughly half the width of the slot 58, 59. The remaining segment 68 of slot width at the closed end 62 is preferably flat and perpendicular to the sides 61 of the slot. The purpose of partially tapering the closed end 62 of the slot 58, 59 is to avoid wedging and retain contact at all times between the tapered surface 66 and the shank 44 of the pin 38 after the pin 38 has fully entered the slot 58, 59. Such contact might be lost if the entire closed end of the slot 62 were perpendicular to the slot sides 61, as in a generally U-shaped slot. By contrast, if a "V" were formed at the closed end of the slot 62 by two tapered surfaces 64, as in the prior art, wedging might occur which would crimp the pin and inhibit free disengagement.

Referring back to FIG. 1, upper module 10 and lower module 12 are connected together by first placing the back end of the upper module 10 onto the front end of the lower module 10 in a position where the rail portions 56 of upper module guide plates 54 are fitted between the walls 34 of the U-shaped channels 32 on the lower module guide plates 28. The fitting or seating of the rail 56 into the corresponding U-shaped channel 32 serves to guide the upper module 10 into a position of correct alignment as the back end of the upper module 10 is slid toward the back end of the lower module 12. As the back ends of the two modules 10, 12 near alignment, the slots 58, 59 on the upper module's guide plates 54 will receive the pins 38, 40 on the lower module's guide plates. More specifically, pin 38 will be received into slot 58 and pin 40 will be received into slot 59.

While the exact dimensions of the slots 58, 59 and pins 38, 40 can vary depending upon such things as module size and weight, the pins 38, 40, in each case, should have heads 42 which are wider that the slots 58, 59 and shanks 44 which are generally narrower than the slots 58, 59. In this way, the slots 58, 59 will be able to fit around the pin shanks 44 and yet be captured between the wider pin head 42 and guide plate base 36. Additionally, the thickness of the material used to form the rail slots 58, 59 should be slightly more than the height of the pin shank 44. In this way, when the pins 38, 40 and slots 58, 59 are engaged, the tapered portion 52 of the shanks 44 will make ongoing contact with the sides 61 of the slots and tend to urge the guide plates 28, 54 more closely together. Besides urging the guide plates 28, 54 together, maintaining this contact is also important for electrically grounding modules containing electrical equipment, such as computer modules. In order to avoid sticking or jamming, the height of the pin shank 44 should not be too much less than the thickness of the slots 58, 59 and the pin flange 46 should be flush with the guide plate base 36, or even slightly recessed.

When the rails 56 of the upper module guide plates 54 have slid sufficiently along the U-shaped channels 32 of the lower module guide plates 28 to move the pins 38, 40 into their respective slots 58, 59, the modules will be locked into engagement in all directions except for a forward movement of the upper module in a motion directly reversing of the motion used to engage the modules. It is the sandwiching of the slot sides 61 between the pin heads 42 and guide plate base 36 which prevents movement up and down. Side-to-side movement is constrained by the capture of the pin shank 44 between the slot sides 61 and by the capture of the rail 56 between the U-shaped channel walls 34. Finally, further backward movement of the upper module is constrained by the pressing of the pin shanks 44 against the closed ends 62 of the slots.

Figure 3:
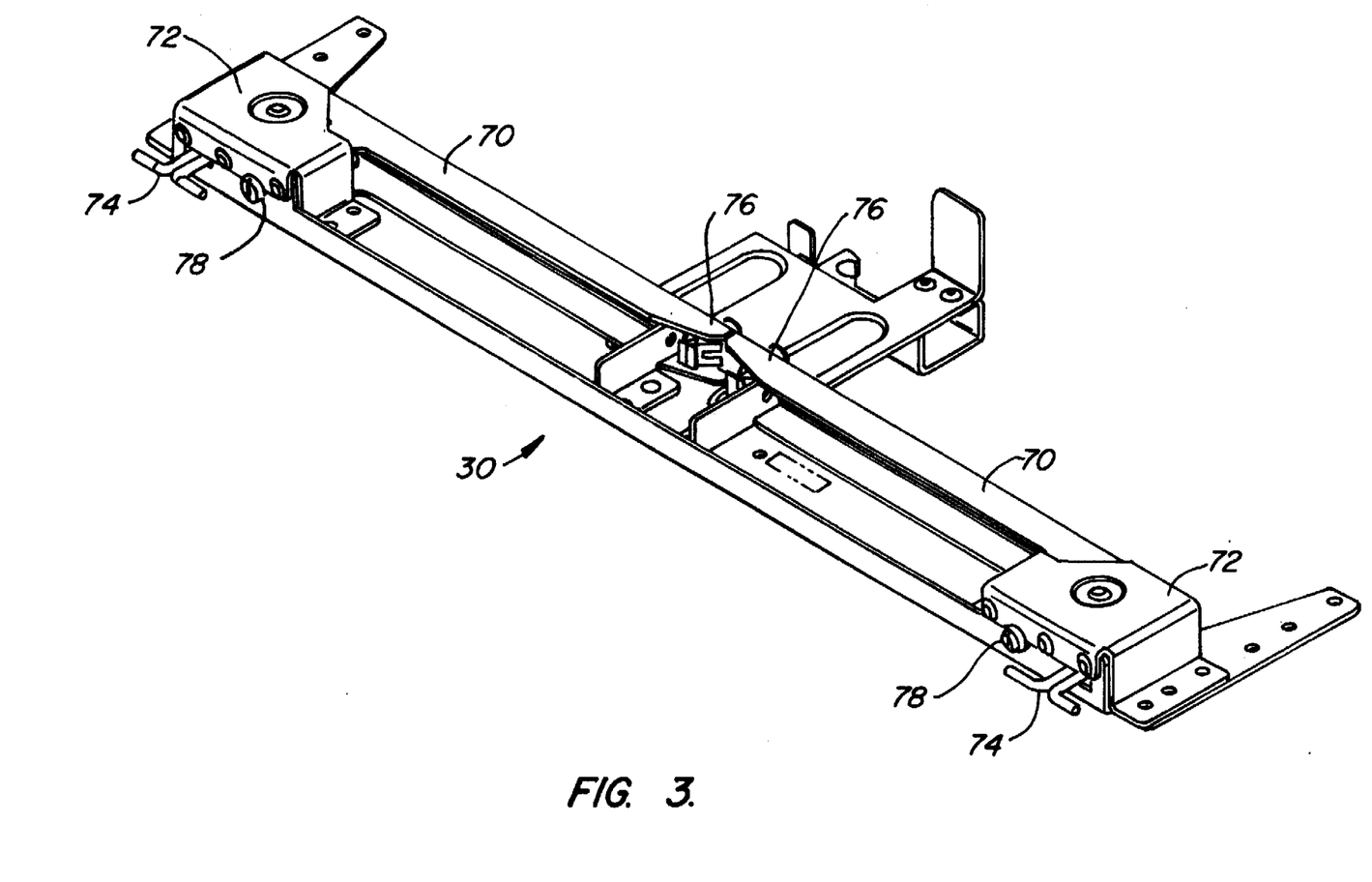
FIG. 3 shows of perspective view of a preferred form of latching assembly of the present invention in the closed position.

To prevent the modules from disconnecting through a forward movement of the upper module 10, a latching assembly 30 is provided. A perspective view of a preferred form of this latching assembly 30, in a closed position, is shown in FIG. 3. In its preferred embodiment, this latching assembly 30 has two sets of symmetrically oriented latch handles 70, pivoting assemblies 72, T-shaped pawls 74, quick release fastening assemblies 76 and counterbalancing springs 78. As with the previous components, the latching assembly components can be constructed from a variety of durable materials including metals and plastics. The operation of these latching assembly components to prevent a forward movement disconnection of the two modules 10, 12 is shown in greater detail in FIGS. 4A and 4B.

Figure 4A:
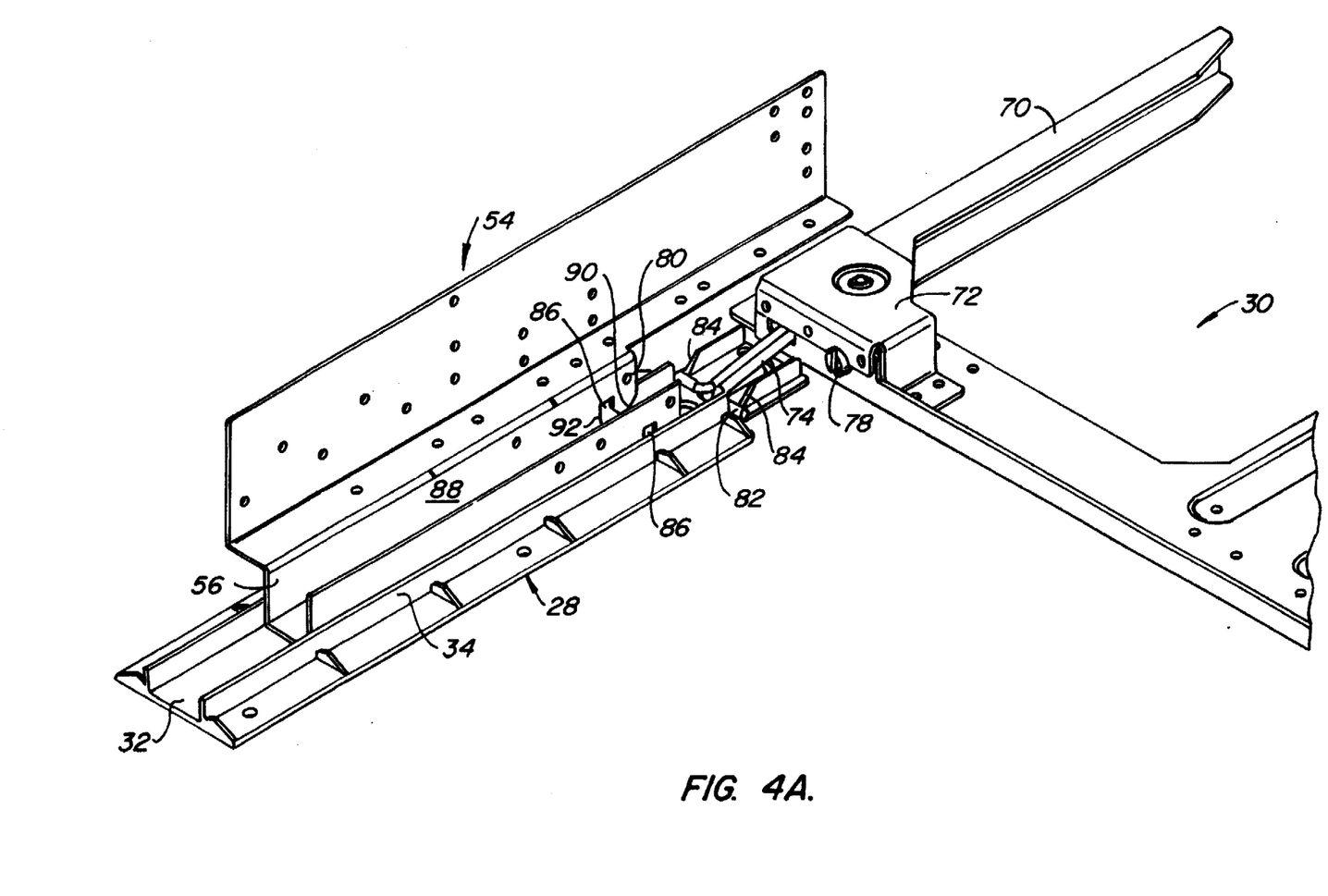
FIG. 4A shows a close-up of the interaction between the latching assembly and guide plates of the present invention when the latching assembly is in an open position.

Referring first to FIG. 4A, the latching assembly 30 is shown next to guide plates 28, 54 with the latching assembly handles 70 in an open position. The function of the latching assembly comes into play after the rail 56 of guide plate 54 has seated itself into the U-shaped channel 32 of guide plate 28 and has had its leading edge 80 slid almost all of the way to the back of the U-shaped channel. As the rail 56 has been slid along the length of the U-shaped channel 32, the latching assembly has been left in its open, receiving position, as shown in FIG. 4A, with latch handles 70 open and T-shaped pawl 74 having its cross piece 82 resting at the bottom of a ramped runner 84 which has been cut out of both walls 34 of U-shaped channel 32. To receive the T-shaped pawl cross-piece 82 during the latching assembly closing movement, a generally rectangular rail slot 86 has been cut out of both side walls 88 of rail 56 near its leading edge 80. Between the rail slot 86 and the leading rail edge 80, the forward side wall segment 90 is cut back and rounded so that this forward segment 90 will avoid contact with the cross-piece 82 of the T-shaped pawl as it slides over that cross-piece 82. Once the forward segment 90 and more deeply cut rail slot 86 slide past the T-shaped pawl cross-piece 82, the T-shaped pawl cross-piece 82 makes contact with the trailing edge 92 of the rail slot and places both guide plates 28, 54 in correct position to be forward locked by the latching assembly 30.

Figure 4B:
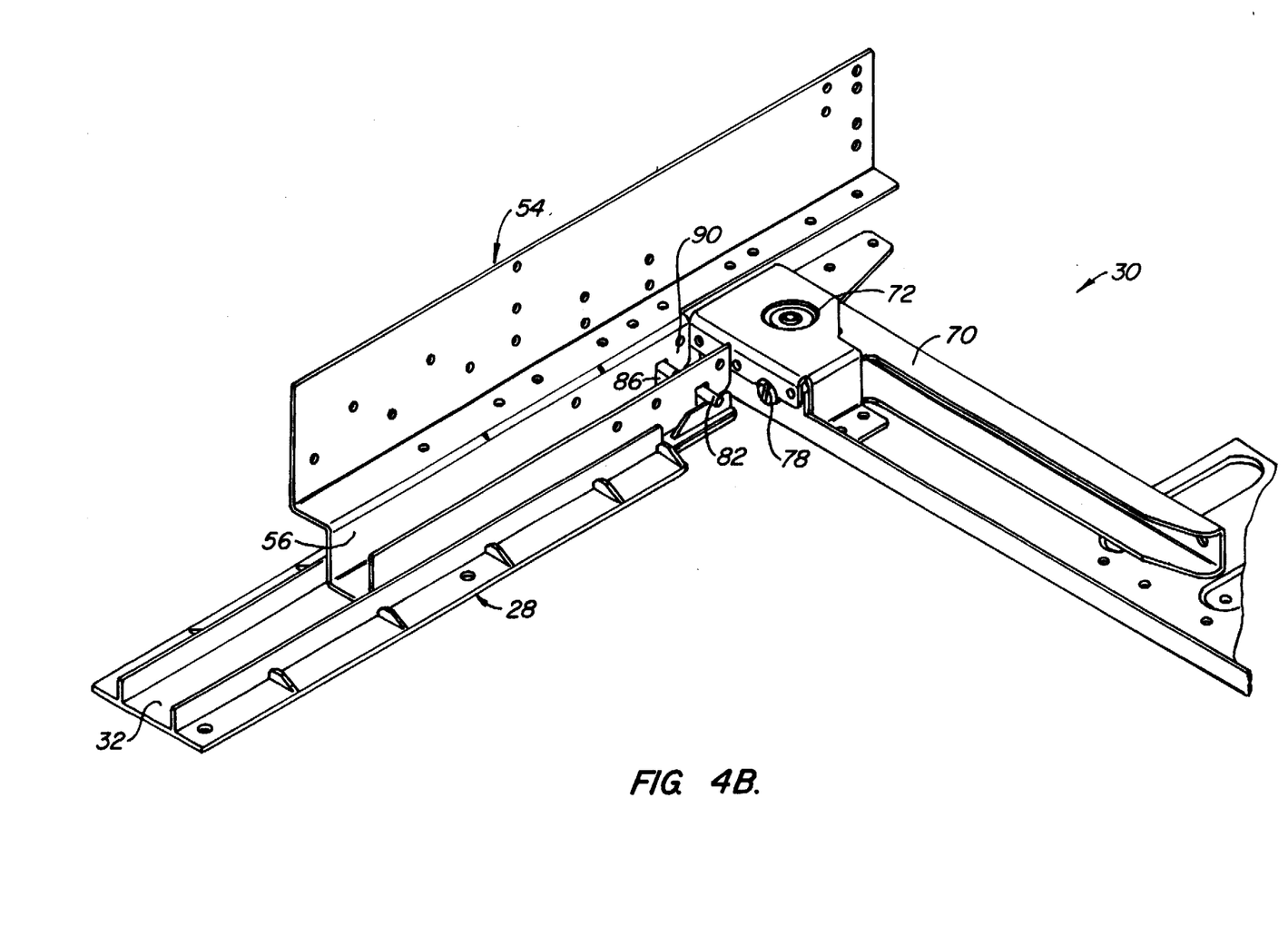
FIG. 4B shows a close-up of the interaction between the latching assembly and guide plates of the present invention when the latching assembly in a closed position.

Referring now to FIG. 4B, the locking process of the latching assembly 30 is illustrated for the guide plate 28, 54 combination on one side of the modules, the locking process for the guide plates 28, 54 on the other side of the modules being merely the mirror image. With the rail slot 86 of the upper guide plate 54 above the ramped runner 84 of the lower guide plate 28, the latch handle 70 can be moved toward its closed position to pivotally cause the T-shaped pawl cross-piece 82 to ride up the ramped runner 84 and into engagement with the rail slot 86. Further movement of the latch handle 70 then causes the T-shaped pawl cross-piece 82 to pull on the forward segment 90 of the upper guide plate 54 until the upper guide plate 54 is moved into its final locking position as shown in FIG. 4B.

Figure 5:
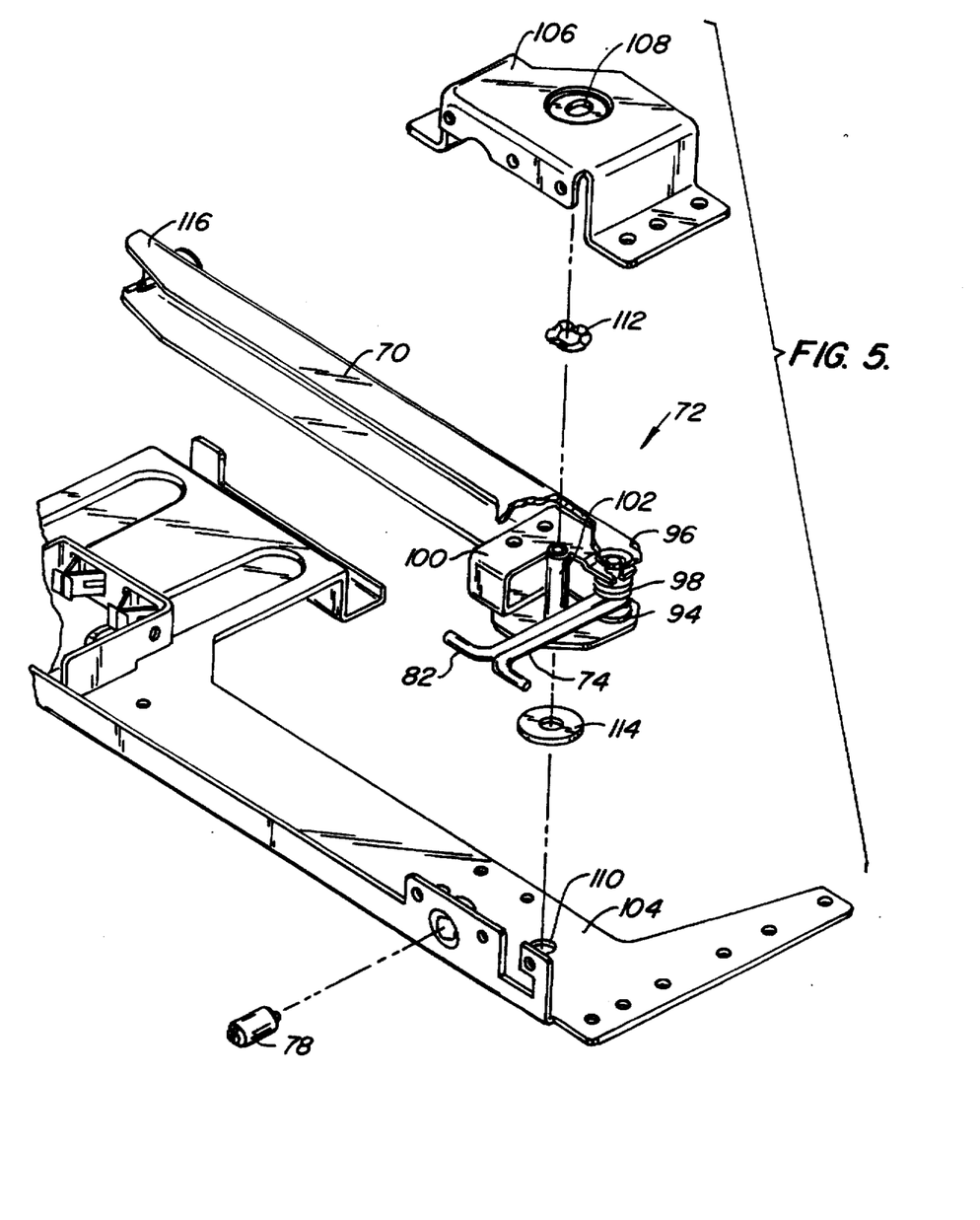
FIG. 5 shows a partial, exploded view of a preferred form of latching assembly of the present invention.

In the preferred embodiment, the T-shaped pawl 74 can be constructed out of a single metal bar. As shown in FIG. 5, two 90° bends can be made in the metal bar to form the T-shaped pawl cross-piece 82 and a third 180° bend can be made between the two 90° bends to form the base of the "T". To add strength, a weld can be made where the two 90° bends meet at the center of the T-shaped pawl cross-piece 82. Of course, other shapes of pawls can also be used, such as "L" or hook shaped pawls, but the T-shaped pawl 74 has been found to be the most effective.

The pivoting mechanism, which allows movement of the latch handles 70 to be translated into a pulling or pushing movement of the T-shaped pawls 74, is best illustrated in FIG. 5. The latch handles 70 and T-shaped pawls 74 are connected together by pivot pin 94. In the preferred embodiment, this pivot pin 94 is bolted, riveted or otherwise immovably affixed to both the latch handle heel 96 and a latch handle reinforcement piece 100 nested within the heel 96. Washers 98 can be inserted around the pivot pin 94 and between the T-shaped pawl 74 and latch handle reinforcement piece 100 to keep the T-shaped pawl 74 from rattling up and down the pivot pin 94.

The latch handle 70 works in conjunction with fulcrum pin 102 to allow the latch handle 70 to act as a lever. To aid in this leveraging, the latch handle reinforcement piece 100 is attached to the latch handle 70 through riveting, welding or other suitable means. The fulcrum pin 102 is then attached not only to the latch handle 70, but also to the body of the lower module 12 through its connection to the latch assembly base 104 and latch assembly cap 106. The latch assembly cap 106 is affixed to the latch assembly base 104 by riveting, bolting or other suitable means. The connection of the fulcrum pin 102 to the latch assembly base 104 and latch assembly cap 106 is made through slots 108, 110. These slots 108, 110 are preferably oval in shape to allow a slight forward and backward movement of the latch handle heel 96 within the confines of these slots 108, 110. This slight movement or "float" provided by the oval slots 108, 110 gives the latch assembly 30 flexibility to adjust for imprecise machining, placement or alignment of the guide plate 28, 54 and latch assembly 30 parts. Washers 112, 114 can be inserted around the fulcrum pin 102 and between the latch handle 70 and latch assembly base connections 104, 106 to allow freer movement of the latch handle 70.

In operation, as the latch handle 70 is pushed forward to close the latch assembly 30, the fulcrum pin 102 translates the latch handle's pushing force into a pulling force on the T-shaped pawl 74. Similarly, when the latch handle 70 is pulled backward to open the latch assembly, the fulcrum pin 102 translates the latch handle's pulling force applied into a pushing force on the T-shaped pawl 74. Because the fulcrum pin 102 is located much closer to the pivot pin 94 than to the toe 116 of the handle, the latching assembly 30 provides a mechanical advantage of approximately 12 to 1 and thereby enables the operator, with little effort, to mate modules with weights as high as 400 pounds.

To avoid jerking and swaying of the modules during this latching process, both latch handles 70 should be operated in unison to provide an even, simultaneous pull on both upper guide plates 54. The simultaneous operation of both latch handles 70 ensures a uniform pressure distribution on the guide plate 28, 54 surfaces on each side of the mating modules 10, 12.

Figure 6:
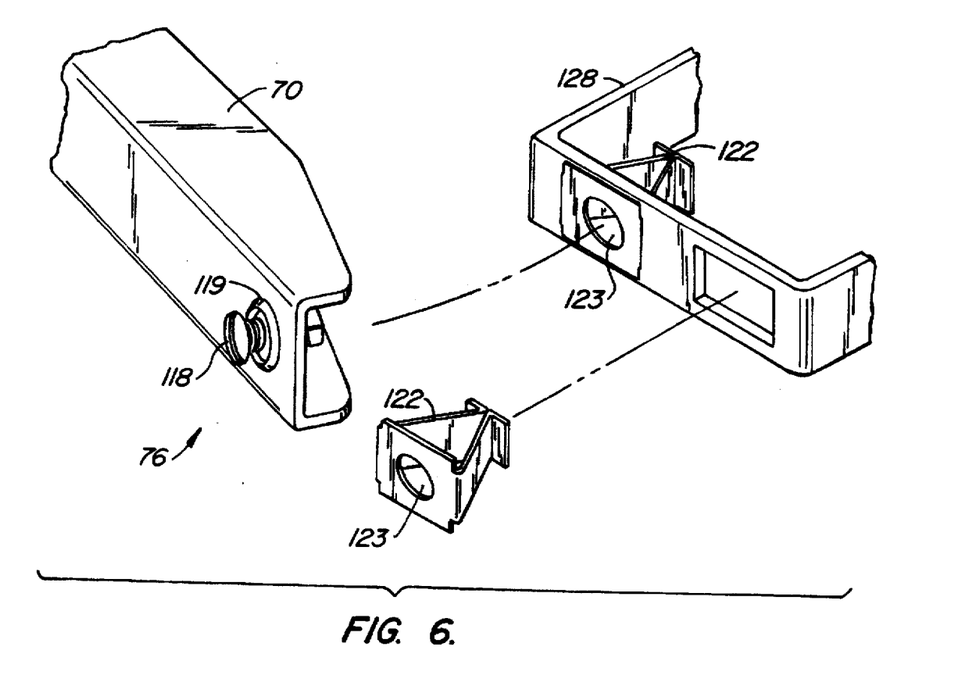
FIG. 6 shows an exploded view of the latching assembly's quick release fastener.
Figure 7A:
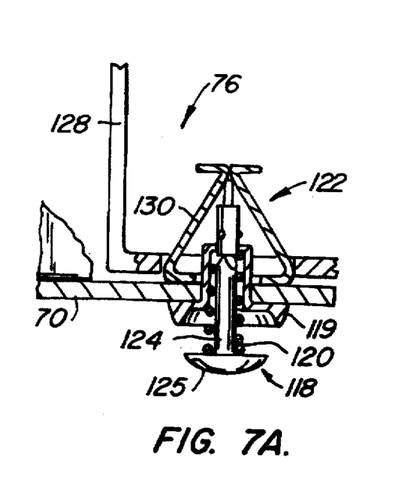
FIG. 7A shows a side view of the latching assembly's quick release fastener during insertion of the fastener screw.
Figure 7B:
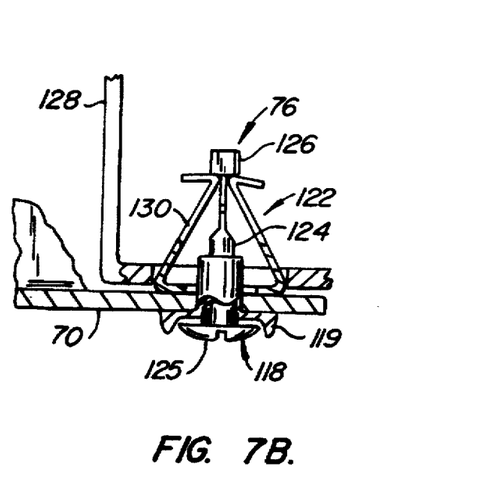
FIG. 7B shows a side view of the latching assembly's quick release fastener when the fastener screw is fully inserted.

Once the latch handles 70 are closed to lock the modules 10, 12 together against a forward movement separation, the quick release fasteners 76 can be employed to prevent the latch handles 70 from inadvertently popping back open. A preferred form of these quick release fasteners 76 are located at the toe 116 of each latch handle 70 and are best illustrated in FIGS. 6, 7A and 7B. The components which make up these quick release fastener 76 include a screw 118, screw holder 119, screw spring 120 and flexible clamp 122. In the preferred embodiment, the fastener screw 118 has a round, threadless shank 124 near its head 125 which is then flattened for the portion of the screw 118 nearest the tip 126. At the very tip of the screw 126, the flattened portion of the shank 124 is twisted approximately 60° relative to the remainder of the flattened portion. This flat, twisted screw tip 126 creates a catch to allow the screw 118 to lock into the flexible clamp 122. Spring 120 is provided to bias the screw 118 in a normally unlocked position as shown in FIGS. 6 and 7A.

To lock the quick release fastener 76, the latch handle 70 is pressed flush against the quick release fastener bracket 128 as shown in FIG. 7A so that the flattened shank portion 124 of the screw is received into the flexible clamp 122 through slot 123. Both the fastener bracket 128 and flexible clamp 122 are immovably attached to the latch assembly base 104 and thereby to the lower module 12. A screwdriver or even a coin (not shown) can then be used to overcome the spring 120 biasing and push the screw tip 126 between the flexible jaws 130 of clamp 122. After the screw tip 126 is pushed past the flexible jaws 130, the screw is given a partial turn (e.g., a quarter turn) so that the screw tip 126 is perpendicular to the flexible jaw opening as shown in FIG. 7B. At this point, the latch handle 70 is locked into the fastener bracket 128 to complete the module connection. While standard machine fasteners known to those of skill in the art, such as a simple screw and threaded slot, can be used to secure the latch handles 70 instead of the present quick release fasteners 76, the present quick release fasteners 76 nonetheless have proved to be particularly appropriate and useful for the latch assembly 30 of the present invention.

The latch assembly 30 also includes counterbalancing springs 78 (FIG. 5). These counterbalancing springs are affixed to latch assembly base 104 and press against the latch handle reinforcement piece 100 when the latch handles 70 are in a closed position. The purpose of this counterbalancing spring is to provide a constant tension force on the latch handles 70 when they are in a closed position. As previously noted, oval slots 108, 110 allow a slight backward to forward movement of the latch handle 70 or "float". When the latch handles 70 are closed, the counterbalancing springs 78 push the latch handles backward. This ensures that the counterbalancing springs 78 are always forcing the interconnection of the modules 10, 12 together. This also ensures that tension is applied even after the module assembly has been subjected to vibration.

To separate the two modules 10, 12 after they have been locked together, one begins by turning the fastening screw 118 for a partial turn until the flattened tip 126 is oriented parallel to the opening in the clamp jaws 130 as shown in FIG. 7A. At this point, the screw spring 120 causes the screw 118 and latch handles 70 to pop away from the fastener bracket 128 and clamp 122. The latch handles 70 can then be pulled open in unison to cause the T-shaped pawls 74 to begin pushing the upper module 10 forward and away from the lower module 12. As the handles 70 approach their fully open position as shown in FIG. 4A, the force of gravity causes the cross-piece 82 of the T-shaped pawl to drop to the bottom of ramped runner 84. At this point, the upper module 10 will be moved forward enough to either fully or partially disengage the tapered pins 38, 40 from their respective tapered slots 58, 59. As such, the upper module 10 can continue to be pulled forward or lifted up to fully disconnect the two modules.

In the foregoing specification, the invention has been described with reference to specific preferred embodiments and methods. It will, however, be evident to those of skill in the art that various modifications and changes may be made without departing from the broader spirit and scope of the invention as set forth in the appended claims. For example, while the preferred embodiment has been illustrated with the pin containing guide plates 28 and latching assembly 30 on top of the lower module and the slot containing guide plates 54 on the bottom of the upper module, the positioning of these guide plates 28, 54 could just as easily be reversed or otherwise oriented. Accordingly, the specification and drawings are to be regarded in an illustrative, rather than restrictive, sense; the invention being limited only by the appended claims.

What is claimed is:

1. In combination, first and second modules and an apparatus for removably connecting said first and second modules into correct alignment wherein said apparatus comprising:
   a latching assembly attached to said first module having a T-shaped pawl pivotally connected to a latch handle, said T-shaped pawl having a shank and a cross-piece with two ends; and,
   a slot on said second module capable of operably engaging both of said cross-piece ends of said T-shaped pawl such that when said T-shaped pawl cross-piece ends engage said slot and said handle is moved from an open to a closed position, said first and second modules are connected into correct alignment.

2. The combination of claim 1 wherein a pin is attached to said latch handle and first module to act as a fulcrum which allows less force to be applied to said handle than is needed to be applied to said pawl to move said first and second modules into correct alignment.

3. The combination of claim 1 further including a second module guide plate attached to said second module in which said slot is formed.

4. The combination of claim 3 wherein a portion of said second module guide plate extends outwardly from said second module and is shaped in the form of a rail.

5. The combination of claim 4 wherein said slot is formed on the outwardly extending portion of said guide plate.

6. The combination of claim 1 wherein said first module further includes a first module guide plate positioned adjacent to said latching assembly.

7. The combination of claim 6 wherein said first module guide plate has an U-shaped channel extending along its length.

8. The combination of claim 7 wherein a ramped runner is cut into a portion of said U-shaped channel to receive said T-shaped pawl cross-piece ends.

9. In combination, first and second modules and an apparatus for removably connecting said first and second modules into correct alignment wherein said apparatus comprising:
   a first guide plate attached to said first module, said first guide plate having an U-shaped channel extending along its length and a ramped runner formed near one end of said U-shaped channel;
   a latching assembly attached to said first module at a position adjacent to said first guide plate, said latching assembly having a pawl extending into said ramped runner which is pivotally connected to a latch handle;

a second guide plate attached to said second module, said second guide plate having an outwardly extending portion formed to engage said U-shaped channel and a slot on said outwardly extending portion capable of engaging said pawl, such that when said outwardly extending portion is engaging said U-shaped channel and said handle is moved from an open to a closed position, said pawl moves up the ramped runner of said first guide plate and into the slot of said second guide plate to connect said first and second modules in correct alignment.

10. The combination of claim 9 wherein said first module includes two parallel first guide plates, said second module includes two parallel second guide plates and said latching assembly has two symmetrically disposed sets of handles and pawls.

11. The combination of claim 9 wherein a pin is attached to said latch handle and said first module to act as a fulcrum which allows less force to be applied to said latch handle than is needed by said pawl to move said first and second modules into correct alignment.

12. The combination of claim 9 further comprising a counterbalancing spring to keep a constant tensioning force on said latch handle when said latch handle is in a closed position.

13. In combination, first and second modules and an apparatus for removably connecting said first and second modules into correct alignment wherein said apparatus comprising:

a first guide plate attached to said first module, said first guide plate having a U-shaped channel extending along its length and a ramped runner formed near one end of said U-shaped channel;

a latching assembly attached to said first module at a position adjacent to said first guide plate, said latching assembly having a pawl extending into said ramped runner which is pivotally connected to a latch handle;

a second guide plate attached to said second module, said second guide plate having an outwardly extending portion formed to engage said U-shaped channel and a slot on said outwardly extending portion capable of engaging said pawl, such that when said outwardly extending portion is in said U-shaped channel and said handle is moved from an open to a closed position, said pawl moves up the ramped runner of said first guide plate and into the slot of said second guide plate to connect said first and second modules in correct alignment; and, a fastening assembly connected to both said latch handle and said first guide plate comprising, a threadless screw attached to said latch handle having a head and flat shank, a portion of said flat shank at the tip of said screw being twisted at an angle to the remainder of the flat shank; and, a clamp to receive said screw, said clamp including jaws to receive said twisted portion of said flat shank when said twisted portion is presented parallel to the jaw opening but disposed to retain said twisted portion when said twisted portion is turned to be perpendicular to the jaw opening.

* * * * *